(12) United States Patent
Kim et al.

(10) Patent No.: US 6,236,903 B1
(45) Date of Patent: May 22, 2001

(54) MULTIPLE REACTION CHAMBER SYSTEM HAVING WAFER RECOGNITION SYSTEM AND METHOD FOR PROCESSING WAFER USING SAME

(75) Inventors: Do-hyeong Kim; Tae-ryong Kim; Byeung-wook Choi; Kwang-jin Jung, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/160,093

(22) Filed: Sep. 25, 1998

(30) Foreign Application Priority Data

Sep. 29, 1997 (KR) .................................... 97-49761

(51) Int. Cl.[7] ............................ G06F 19/00; B65G 49/07
(52) U.S. Cl. ...................... 700/121; 700/115; 700/116; 700/215; 700/221; 414/936
(58) Field of Search ................................. 700/121, 115, 700/116, 215, 221, 225, 226; 414/936

(56) References Cited

U.S. PATENT DOCUMENTS

| | | | | |
|---|---|---|---|---|
| 5,149,948 | * | 9/1992 | Chisholm | 235/462.06 |
| 5,432,702 | * | 7/1995 | Barnett | 700/116 |
| 5,602,377 | * | 2/1997 | Beller et al. | 235/462.15 |
| 5,602,379 | * | 2/1997 | Uchimura et al. | 235/462.11 |
| 5,928,389 | * | 7/1999 | Jevtic | 29/25.01 |
| 5,975,740 | * | 11/1999 | Lin et al. | 700/99 |
| 6,027,301 | * | 2/2000 | Kim et al. | 414/416 |
| 6,122,566 | * | 9/2000 | Nguyen et al. | 700/218 |
| 6,146,077 | * | 11/2000 | Shin et al. | 414/404 |

FOREIGN PATENT DOCUMENTS

| | | |
|---|---|---|
| 94-10265 | 5/1994 | (KR) . |
| 97-30570 | 6/1997 | (KR) . |

* cited by examiner

*Primary Examiner*—William Grant
*Assistant Examiner*—Paul Rodriguez
(74) *Attorney, Agent, or Firm*—Jones Volentine, LLC

(57) ABSTRACT

A multiple reaction chamber system includes a transfer chamber, a load lock chamber connected to the transfer chamber, and a plurality of reaction chambers connected to the transfer chamber. An alignment chamber is connected to the transfer chamber, disposed along a path of wafer transfer from the load lock chamber to the plurality of reaction chambers, and includes a wafer aligner. A wafer recognition, disposed along a post-aligner portion of the path of wafer transfer system, recognizes an identification code of an individual wafer. A controlling system is in data communication with the wafer recognition system for selecting a selected chamber of the plurality of reaction chambers into which the individual wafer is to be transferred. Because individual wafers can be associated with each reaction chamber, a defective reaction chamber can be identified immediately and its use discontinued so that unproductive operations can be eliminated.

22 Claims, 5 Drawing Sheets

MULTIPLE REACTION CHAMBER SYSTEM HAVING WAFER RECOGNITION SYSTEM AND METHOD FOR PROCESSING WAFER USING SAME

BACKGROUND OF THE INVENTION

1. Field of the Invention

The present invention relates to a multiple reaction chamber system and a method of processing a wafer using the same, and more particularly, to a multiple reaction chamber system having an individual wafer recognition system, and a method of processing a wafer using the same.

2. Description of the Related Art

Because modem, highly integrated semiconductor devices are complicated to manufacture, manufacturing productivity can be increased by converting a single reaction chamber system into a multiple reaction chamber system.

As shown in FIG. 1, a conventional multiple reaction chamber system 26 includes a transfer chamber 10 and a plurality of other chambers connected to the transfer chamber 10. More specifically, first and second load lock chambers 12 and 14, and an align chamber 16 having a wafer aligner 16a for aligning wafers, are connected to the transfer chamber 10. First and second reaction chambers 18 and 20 are also connected to the transfer chamber 10. Each chamber is closed to prevent wafers from being exposed to air.

In FIG. 1, solid line arrows A, dashed line arrows B and dotted line arrows C indicate the various paths for moving a wafer among the chambers.

A wafer loaded in either the first or second load lock chamber 12 or 14, for example, the first load lock chamber 12, is transferred to the align chamber 16 along one of the solid line paths A. After the wafer is aligned in the align chamber 16, the wafer is transferred to either the first or second reaction chamber 18 or 20, for example, the first reaction chamber 18, along one of the other solid line paths A. The reaction chamber 18 or 20, for example, the first reaction chamber 18, processes the wafer. Then, the wafer is transferred to the first load lock chamber 12 via the transfer chamber 10 along one of the dashed line paths B, or to the second load lock chamber 14 via the transfer chamber 10 along one of the dotted line paths C. The other wafers loaded in the first and second load lock chambers 12 and 14 are also handled through the same alternative paths as the first selected wafer.

When a wafer is not properly processed due to a malfunction of the first reaction chamber 18, the second reaction chamber 20 should be used instead of the first reaction chamber 18. However, when the conventional multiple reaction chamber system is used the previous paths are simply repeated. Thus, some wafers will continue to be processed in the malfunctioning reaction chamber. Accordingly, the wafer processing process continues until inferior wafers are detected among the processed wafers. Furthermore, even when inferior wafers are detected, it is not known which reaction chambers they were processed in. Thus, a lot of time is required to solve the problem, so that productivity of the semiconductor device manufacturing facility is lowered.

SUMMARY OF THE INVENTION

To solve the above problem, it is an object of the present invention to provide a multiple reaction chamber system comprising a wafer recognition system for easily recognizing which wafer is being processed in which reaction chamber and matching a processed wafer with a reaction chamber.

It is another object of the present invention to provide a method of processing wafers using the multiple reaction chamber system.

Accordingly, to achieve these objects and other objects and advantages of the present invention, a multiple reaction chamber system includes a transfer chamber, a load lock chamber connected to the transfer chamber, and a plurality of reaction chambers connected to the transfer chamber. An alignment chamber is connected to the transfer chamber, disposed along a path of wafer transfer from the load lock chamber to the plurality of reaction chambers, and includes a wafer aligner. A wafer recognition system, having means for recognizing an identification code of an individual wafer, is disposed along a post-aligner portion of the path of wafer transfer. A controlling system is in data communication with the wafer recognition system for selecting a designated chamber of the plurality of reaction chambers into which the individual wafer is to be transferred.

In another aspect of the invention, a method for processing wafers in a multiple reaction chamber system includes forming a recognition code on a wafer. Then the wafer is loaded into a load lock chamber of the multiple reaction chamber system having a plurality of reaction chambers and an alignment chamber. The wafer is transferred into the alignment chamber and aligned. A wafer recognition system recognizes the recognition code on the wafer. Next, it is decided which one of the plurality of reaction chambers is to process the wafer, and the wafer is processed in the selected one of the plurality of reaction chambers. After this processing, the wafer is inspected.

The present invention provides data that can be managed according to wafers and reaction chambers. Thus, it can be accurately recognized which wafer was processed in which reaction chamber during processing, and therefore which chamber is producing defective wafers, if any. Based on this, a controlling system can prevent wafers from being processed in a malfunctioning reaction chamber, and thus reduce unnecessary operations. Therefore, reliability and productivity of the semiconductor device manufacturing facility can be improved.

BRIEF DESCRIPTION OF THE DRAWINGS

The present invention is described with reference to the attached drawings in which.

DESCRIPTION OF THE PREFERRED EMBODIMENT

Figure 1:
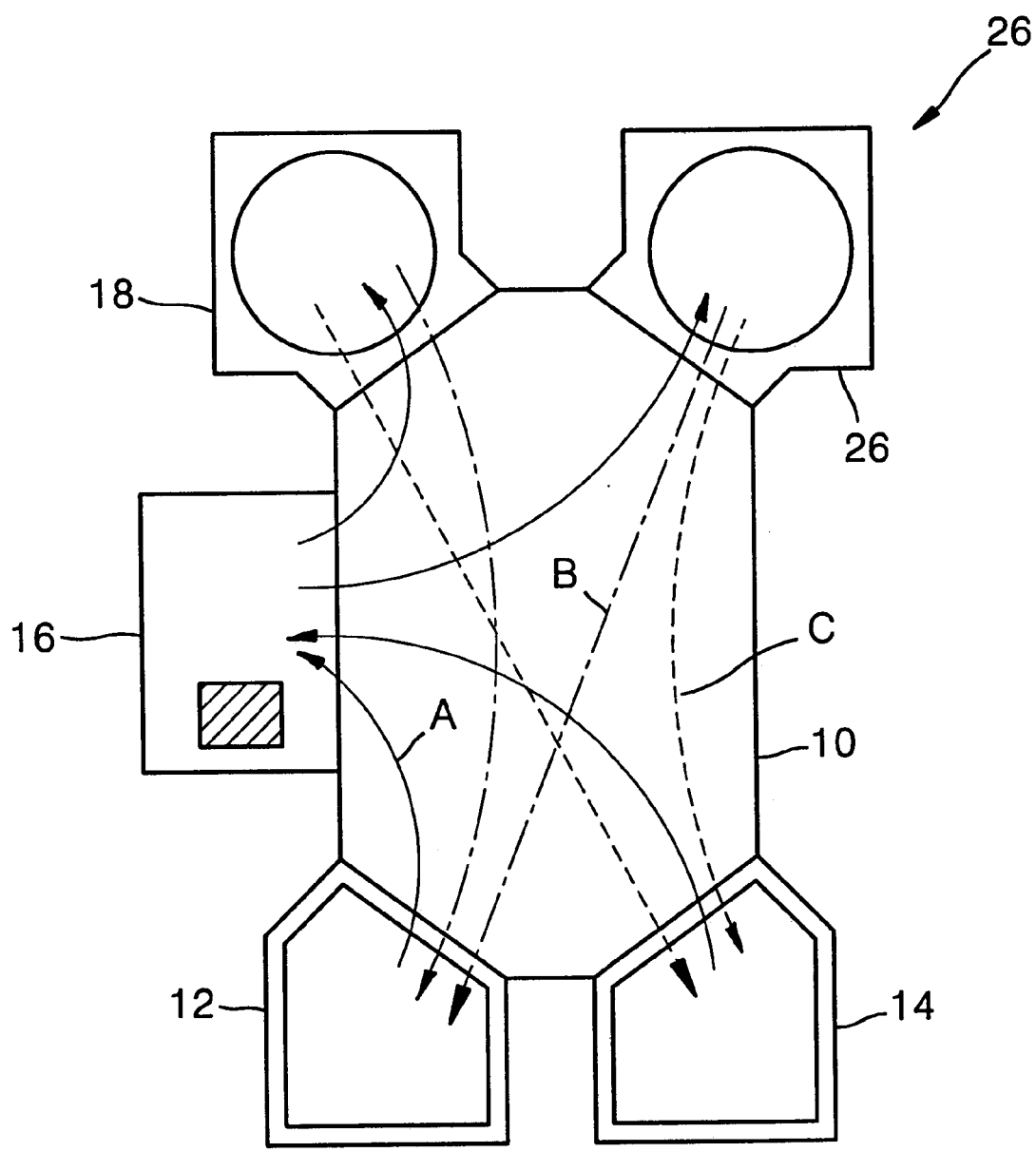
FIG. 1 is a schematic plan view of a conventional multiple reaction chamber instrument.

Referring to FIG. 2, a multiple reaction chamber system according to the present invention includes a multiple reaction chamber apparatus 66 having a transfer chamber 40 to which is connected at least one load lock chamber 42, an alignment chamber 46, and a plurality of reaction chambers, e.g., first and second reaction chambers 48 and 50. It is understood that additional load lock chambers, e.g., load lock chamber 44, and/or additional reaction chambers (not shown), can be further connected to the transfer chamber 40. The multiple reaction chamber apparatus also includes a wafer recognition system 60.

Figure 2A:
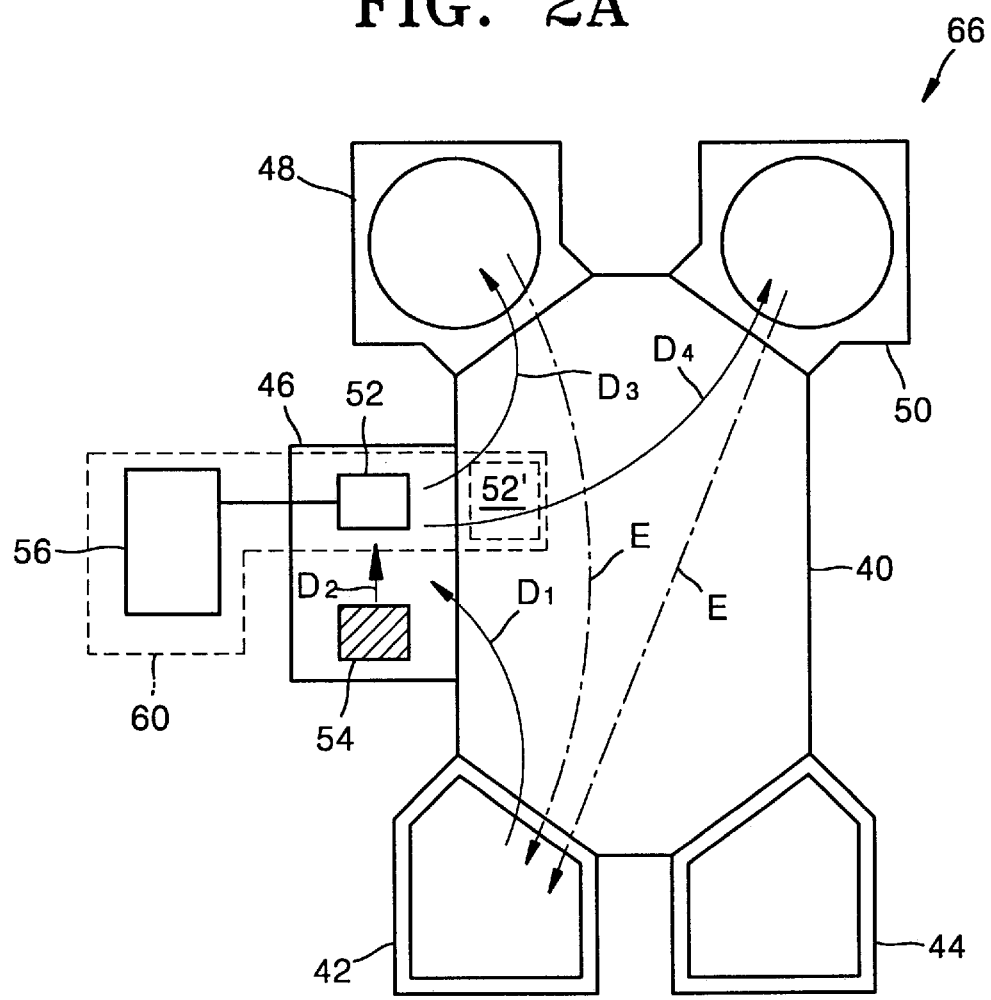
FIG. 2A is a schematic plan view of a multiple reaction chamber instrument according to the present invention.

In the embodiment shown in FIG. 2A, a wafer cassette (not shown) is loaded into each of the first and second load lock chambers 42 and 44. Wafers to be processed are loaded into slots of the wafer cassettes. Each wafer must have a unique identifier, for example a recognition code formed on the surface of the wafer. In some embodiments, a unique recognition code is engraved in each of the wafers in an region where semiconductor device elements are not formed, i.e., in a non-patterned portion of the wafer. In some other embodiments, the unique recognition code is embossed in the non-patterned portion. In the preferred embodiment, the non-pattern portion used is in the flat zone of the wafer.

The alignment chamber 46 includes a wafer aligner 54 for aligning wafers. In the preferred embodiment, the alignment chamber 46 includes the wafer recognition system 60 used for recognizing the wafers. The wafer recognition system 60 includes a wafer recognition sensing unit 52 attached to the alignment chamber 46, and a wafer recognition interpreting unit 56 in data communication with the recognition sensing unit 52 for managing data of recognized wafers.

Arrows D with a solid line represent transfer paths along which wafers are transferred from the first or second load lock chamber 42 or 44 to the reaction chambers. Arrows E with a dashed line represent return paths along which wafers are transferred from the reaction chambers to the first load lock chamber 42. As can be seen, all transfer paths pass through the alignment chamber 46. In particular, arrows D2, D3 and D4 represent post-aligner portions of the transfer path, i.e., portions of the transfer paths after the wafers have been aligned on the wafer aligner 54. In the present invention, the wafer recognition system 60 is disposed somewhere along the post-aligner portions of the transfer paths. In the preferred embodiment, the wafer recognition system 60, or at least the wafer recognition sensing unit 52, is placed in the alignment chamber 46, but it is anticipated that it can be placed outside the alignment chamber, for example, in the transfer chamber 40 as shown by the dashed box 52', especially at a position along the post-aligner portion paths before such paths diverge significantly toward the respective reaction chambers.

Figure 2B:
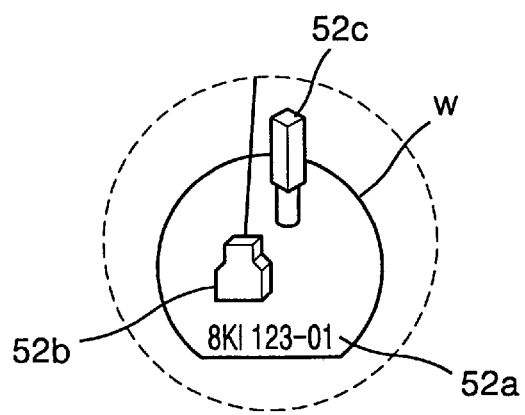
FIG. 2B is a more detailed schematic view of a wafer recognition senor unit of FIG. 2A.

As shown in FIG. 2B, an alphanumeric type identification code represents the recognition code 52a in an individual wafer W. The recognition code could also comprise other suitable code types, e.g., an alphabetic code, a numeric code, or a bar code.

The wafer recognition sensing unit 52 can have various shapes and configurations as a means for recognizing a recognition code 52a. For example, the wafer recognition sensing unit 52 can be a unit for optically recognizing the recognition code 52a, e.g., the sensing part of an optical character reader (OCR) or a bar code reader. It is also anticipated that the wafer recognition sensing unit 52 can be a unit for reading magnetic formations or other physically embodied codes.

In the preferred embodiment, an OCR is used as the wafer recognition system 60. Here, the wafer recognition sensing unit 52 includes a light emitting unit 52b for illuminating the recognition code 52a and a light receiving unit 52c for receiving light reflected by the recognition code 52a. The light emitting unit 52b is a light emitting diode. The light receiving unit 52c is preferably a charged coupled device (CCD) camera. The light emitting unit 52b and the light receiving unit 52c are connected to the wafer recognition interpreting unit 56. The wafer recognition interpreting unit 56 of an OCR system includes the OCR controller as is described in more detail below.

Figure 3:
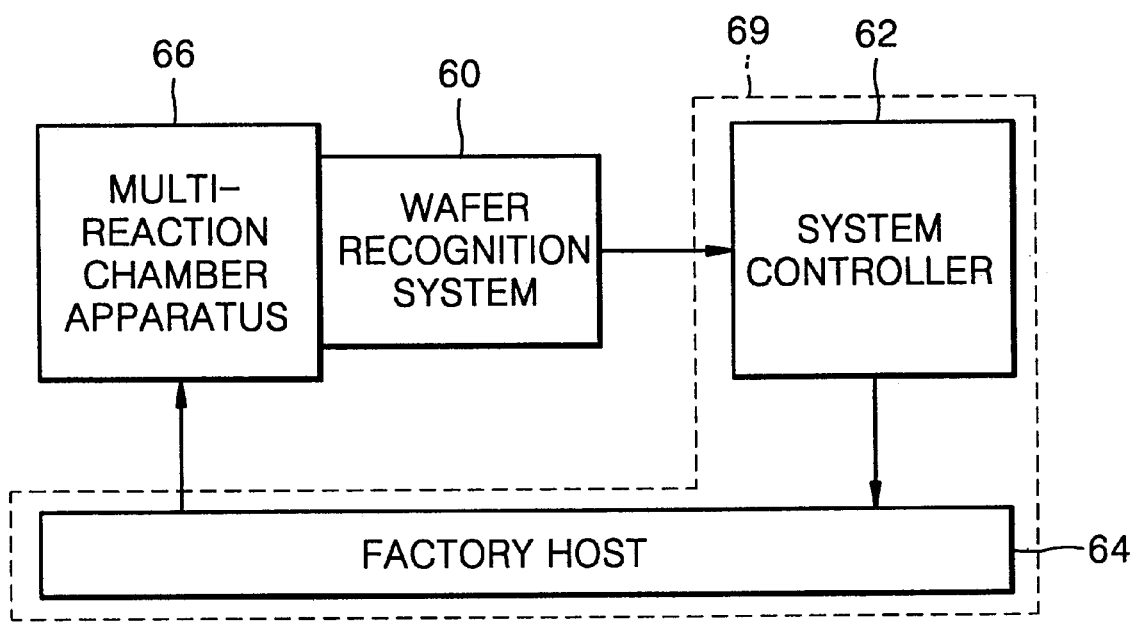
FIG. 3 is a block diagram illustrating the multiple reaction chamber system according to the present invention.

The multiple reaction chamber system of the present invention includes a controlling system 69 as shown in FIG. 3. In typical embodiments, the controlling system 69 includes a multiple reaction chamber system controller 62 and the factory master system, e.g., a factory host computer 64. In particular, the transfer of wafers through the transfer chamber (40 in FIG. 2A) to the various other chambers of the multiple reaction chamber apparatus 66 are directed by signals that originate in the controlling system 69. The present invention connects the wafer recognition system 60 to the controlling system 69 so that recognition data, including the recognition code of an individual wafer, can be communicated to the controlling system 69.

In the preferred embodiment, the wafer recognition interpreting unit (56 in FIG. 2) is in data communication with the multiple reaction chamber system controller 62, which is in data communication with the factory master system, e.g., the factory host 64.

Referring to FIGS. 2A, 2B and 3, a wafer is loaded into the alignment chamber 46 and is recognized; then recognition data, including the recognition code 52a, is transmitted to the controlling system 69 which selects a reaction chamber to process the recognized wafer. As a result, the reaction chambers in which the processing occurs are identified. That is, it is known which wafer is processed by which reaction chamber. Thus, when the processing capability of one of the reaction chambers, e.g., 48, is degraded, stored data is analyzed in the controlling system 69 to determine a malfunctioning reaction chamber. Then the controlling system 69 prevents the malfunctioning reaction chamber from being used continuously. Therefore, productivity of processing wafers can be increased and wafer yield can be improved for the semiconductor device manufacturing facility.

Data about an individual wafer recognized by the wafer recognition system 60, including the recognition code of the wafer, is transmitted to the multiple reaction chamber system controller 62 via a cable. Here, after the recognition code of the individual wafer is checked, a decision is made, and a reaction chamber to process the individual wafer is selected. The wafer is transferred to the selected reaction chamber and processed therein. Also, the result from inspecting the wafer is stored. Data stored in the system controller 62 as described above is transferred to a factory host 64, analyzed, stored, and fed back to various instruments including the multiple reaction chamber apparatus 66. As a result, it is known which inspected wafer was processed by which reaction chamber.

Figure 4:
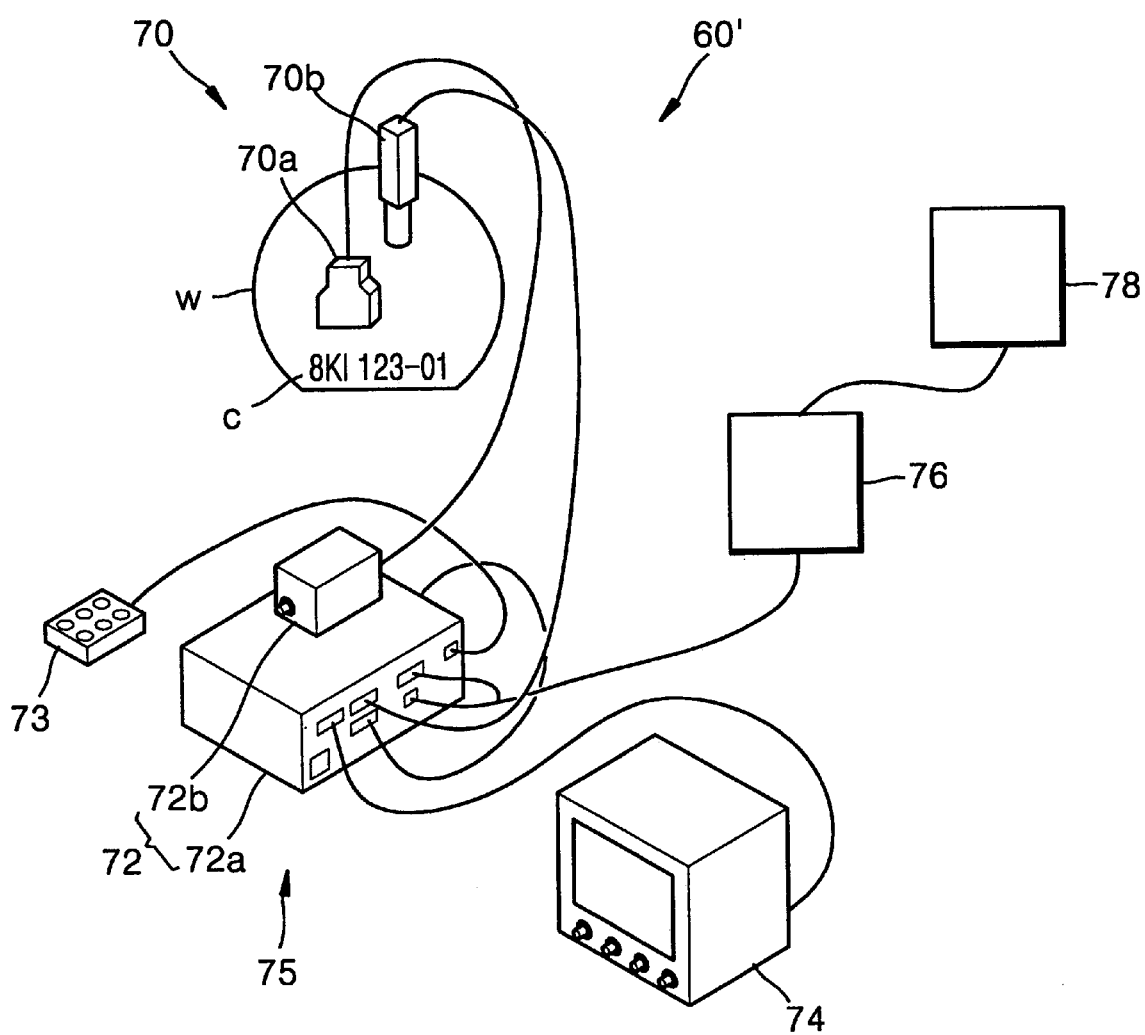
FIG. 4 illustrates the configuration of a wafer recognition system provided in the multiple reaction chamber system according to the preferred embodiment of the present invention.
Figure 5:
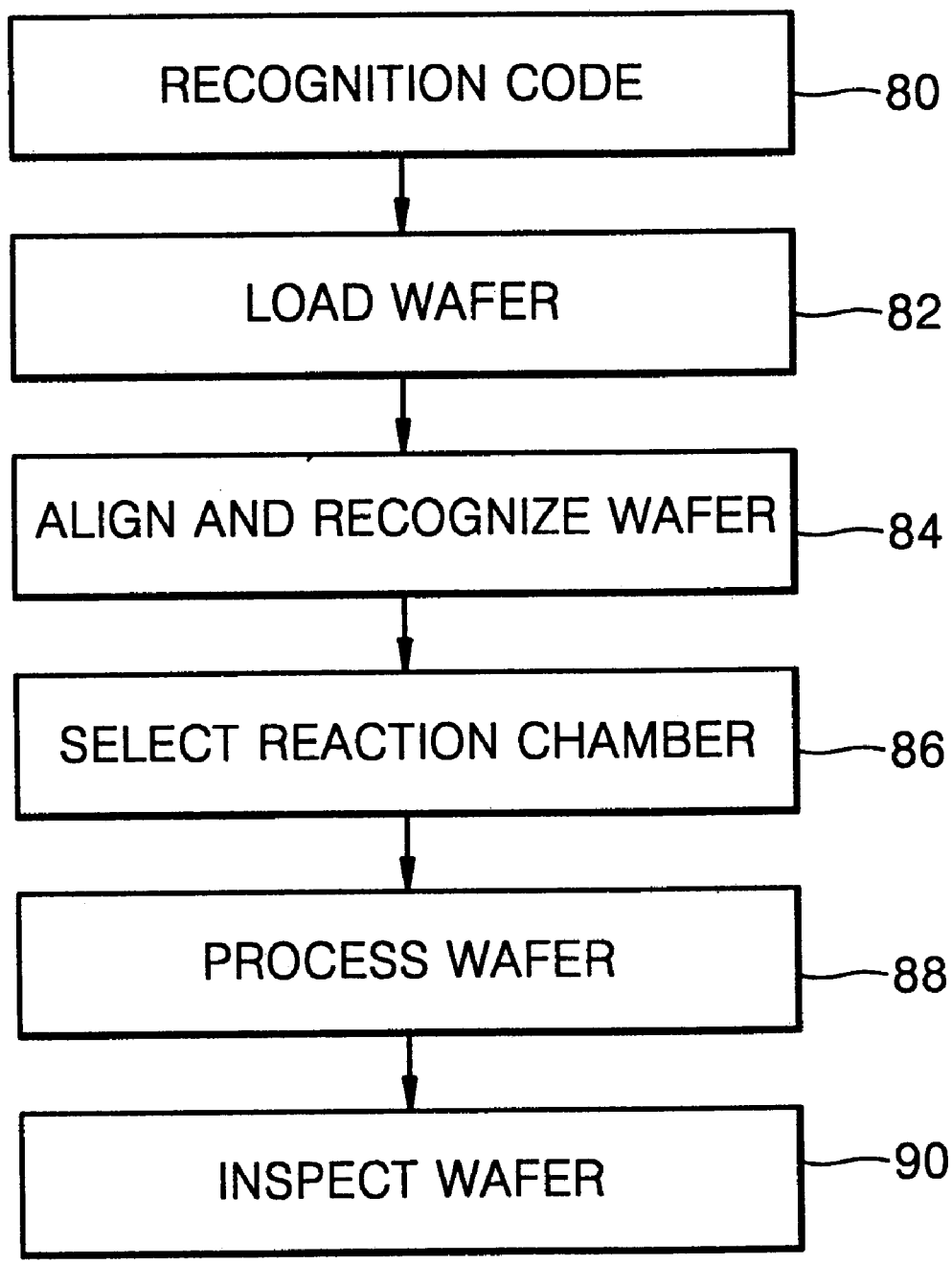
FIG. 5 is a flow chart illustrating a wafer processing method according to the present invention.

FIG. 4, illustrates in detail the components of a wafer recognition system 60'. The wafer recognition system 60' comprises a wafer recognition sensing unit 70 for reading a recognition code "C" engraved in a wafer W, and a wafer recognition interpreting unit 75. The interpreting unit 75 comprises: an OCR controller 72 connected to the wafer recognition unit 70, first and second interface boards 76 and 78 sequentially connected to a first signal output port of the OCR controller 72; a monitor 74 connected to a second signal output port of the OCR controller 72; and a remote controller 73. A video signal is output to the second signal output port for display on the monitor 74.

Data recognized from the wafer recognition sensing unit 70 is transferred to the first and second interface boards 76 and 78 via the OCR controller 72, and to a multiple reaction chamber system controller (62 in FIG. 3). A reaction chamber to process an individual wafer is selected based on data transmitted to the multiple reaction chamber system controller (62 in FIG. 3). Also, wafer recognition data is transmitted from the OCR controller 72 to the monitor 74, so that the recognized wafer can be checked via the monitor 74.

The wafer recognition sensing unit 70 includes a light emitting unit 70a for illuminating a formation corresponding to a recognition code C on a wafer W, and a light receiving unit 70b for receiving light reflected by the formation corresponding to the recognition code C. The type of recognition code C is one selected from the group consisting of a bar code type, an alphabetic code type, a numerical code type, and an alphanumerical code type. It is preferable that the alphabetic code is composed of English characters, but it can be formed of other characters. A wafer recognition code, i.e., recognition code C, is formed in a zone of a wafer where elements are not formed, e.g., in a flat zone. Here, the recognition code is formed in the flat zone by coating, embossing or engraving. The light emitting unit 70a can be anything that can emit light. The light emitting diode described above is an example. The light receiving unit 70b can be anything which can receive light. The CCD camera described above is an example.

The wafer recognition interpreting system is comprised of an OCR controller 72 consisting of an OCR controller unit 72a and a power supply 72b for supplying power to the light emitting unit 70a. The light receiving unit 70b is connected to an external signal input port of the OCR controller unit 72a via a cable. The monitor 74 is connected to a signal output port of the OCR controller unit 72a, such that it can monitor a wafer recognized by the wafer recognition sensing unit 70. The wafer recognition interpreting unit 75 includes an operation panel, and also includes a remote controller 73 in data communication with the OCR controller unit 72a such that remote control is possible. The data communication of the remote controller 73 shown in FIG. 4 is wired, but the data communication could also be wireless. The first and second interface boards 76 and 78, through which data including the recognition code C is transmitted as corresponding first and second signals, are in data communication with the OCR controller unit 72a. Again this communication could be wireless. The second interface board 78 is in data communication with the reaction chamber system controller (62 in FIG. 3).

The aforementioned multiple reaction chamber system may be a chemical vapor deposition (CVD) system, a sputter system, a dry etch system, or another system utilizing a reaction chamber.

The method for processing a wafer using the multiple reaction chamber system will be described in detail, referring to the attached drawings. Referring to FIGS. 2–5, the first step 80 comprises forming a wafer recognition code. To be more specific, the recognition code is formed in a non-patterned zone, e.g., a top or flat zone of a wafer, in order to identify wafers individually. The recognition code type is one selected from the group consisting of a numerical code type, an alphabetic code type, an alphanumerical code type, and a bar code type. The recognition code is coated or embossed or engraved in the non-patterned zone of the wafer.

The second step 82 is loading wafers into the multiple reaction chamber apparatus 66. After a wafer is loaded into a wafer cassette, the wafer cassette is loaded into either the first or second load lock chamber 42 or 44 of the multiple reaction chamber system.

The third step 84 is aligning and recognizing wafers. A wafer selected from among the wafers loaded in the first and second load lock chambers 42 and 44 is transferred into the alignment chamber 46. Next, the transferred wafer is accurately aligned on a wafer processing electrode, for subsequent processing in one of the reaction chambers. Then, the recognition code of the wafer is recognized by the wafer recognition sensing unit 52 of the wafer recognition system 60.

The fourth step 86 is selecting a wafer processing chamber. The result of the recognition in the third step 84 is transmitted to the controlling system 69 to check the recognition code of the recognized wafer and select a reaction chamber to process the recognized wafer. For example, if neither chamber is malfunctioning and the first wafer is processed in the first reaction chamber 48, the second reaction chamber 50 will be selected in this step. The controlling system 69 also records the data, including the wafer recognition code and allotted reaction chamber. The controlling system 69 also retrieves stored data. If stored data indicate that a particular reaction chamber is malfunctioning, the selected chamber will be different than the malfunctioning chamber.

The fifth step 88 is processing wafers. To be more specific, after a reaction chamber to process the recognized wafer is selected, the wafer is loaded into the selected reaction chamber, e.g., the first reaction chamber 48, and then the wafer is processed. Afterwards, the first wafer is transferred to the first or second load lock chamber 42 or 44 and loaded into the corresponding wafer cassette. The other wafers loaded in the first and second load lock chambers 42 and 44 are handled in the same manner as the first or second wafers.

A sixth step 90 is inspecting wafers. To be more specific, the completely-processed wafer is inspected, to determine whether wafer processing, e.g., wafer etching, was properly performed, thereby determining whether the reaction chamber is operating normally or malfunctioning. The wafer inspection results are reported to and stored by the controlling system 69.

If, for example, it is found during the inspecting 90 that several wafers processed by the first reaction chamber 48 were not properly etched, it is determined during the selecting 86 of a subsequent operation of the method that the first reaction chamber 48 is malfunctioning. Then the selected chamber would be a reaction chamber other than the malfunctioning reaction chamber, e.g. other than the first reaction chamber 48. Thus continued use of the malfunctioning reaction chamber 48 is prevented, and productivity of the manufacturing is improved.

As described above, the conventional multiple reaction chamber does not include a unit for recognizing the wafers individually. Therefore, when a reaction chamber malfunctions, a lot of time and many steps are required to determine in which reaction chamber a wafer was processed and therefore which reaction chamber to avoid.

However, the multiple reaction chamber according to the present invention includes a wafer recognition system such as the OCR system. This system is connected to a controlling system. The wafers loaded in an alignment chamber are aligned, the wafers are recognized individually, and allotted reaction chambers to process the recognized wafers are recorded. Accordingly, if the processing capability of a reaction chamber deteriorates during processing and is detected by inspecting, then, since it can easily be determined which wafer is processed in which reaction chamber, the continuing use of the corresponding malfunctioning reaction chamber is prevented. Consequently, operation time required to analyze the processing capability of the reaction chamber can be saved in the semiconductor device manufacturing facility, and also the yield of wafers can be increased.

The present invention is not limited to the aforementioned embodiments, and it is apparent that various alterations may be effected by those of ordinary skill in the art within the technical spirit and scope of the present invention. Therefore it is intended that the invention include those embodiments that fall within the scope of the appended claims and their equivalents.

What is claimed is:

1. A multiple reaction chamber system comprising:
    a transfer chamber;
    a load lock chamber connected to the transfer chamber;
    a plurality of reaction chambers connected to the transfer chamber; and
    an alignment chamber connected to the transfer chamber, disposed along a path of wafer transfer from the load lock chamber to the plurality of reaction chambers, comprising a wafer aligner;
    a wafer recognition system having means for recognizing an identification code of an individual wafer, disposed along a post-aligner portion of the path along which portion wafers are transferred inside the multiple reaction chamber system from the wafer aligner to any of the reaction chambers; and
    a controlling system in data communication with the wafer recognition system and with the transfer chamber for selecting a designated chamber of the plurality of reaction chambers, whereby the individual wafer is transferred into the designated chamber.

2. The multiple reaction chamber system of claim 1, the wafer recognition system comprising:
    a wafer recognition sensing unit attached to the alignment chamber; and
    a wafer recognition interpreting unit in data communication with the wafer recognition sensing unit.

3. The multiple reaction chamber system of claim 2, wherein a code type of the identification code is one selected from a group consisting of a numerical code type, an alphabetic code type, an alphanumerical code type, and a bar code type.

4. The multiple reaction chamber system of claim 2, the controlling system comprising:
    a multiple reaction chamber system controller in data communication with the wafer recognition interpreting unit; and
    a factory master system in data communication with the multiple reaction chamber system controller and with the transfer chamber.

5. The multiple reaction chamber system of claim 1, wherein said wafer recognition system is disposed in said transfer chamber.

6. The multiple reaction chamber system of claim 1, wherein said wafer recognition system is disposed in said alignment chamber.

7. The multiple reaction chamber system of claim 1, wherein the wafer recognition system is an optical character recognition (OCR) system for optically recognizing a recognition code.

8. The multiple reaction chamber system of claim 7, the wafer recognition system comprising:
    a wafer recognition sensing unit attached to the alignment chamber, and
    a wafer recognition interpreting unit in data communication with the wafer recognition sensing unit; and
    the wafer recognition interpreting unit comprising:
        an OCR controller in data communication with the wafer recognition sensing unit, including a first signal output port, a second signal output port and a remote controller port,
        a remote controller in data communication with the remote controller port,
        a first interface board in data communication with the first signal output port,
        a second interface board in data communication with the first interface board, and
        a monitor in data communication with the second signal output port.

9. The multiple reaction chamber system of claim 8, the wafer recognition sensing unit comprising:
    a light emitting unit for illuminating the recognition code; and
    a light receiving unit for receiving light reflected by the recognition code.

10. The multiple reaction chamber system of claim 9, wherein the light emitting unit is a light emitting diode.

11. The multiple reaction chamber system of claim 9, wherein the light receiving unit is a charge coupled device (CCD) camera.

12. The multiple reaction chamber system of claim 8, the controlling system comprising:
    a multiple reaction chamber system controller connected to the second interface board; and
    a factory master system in data communication with the multiple reaction chamber system controller and with the transfer chamber.

13. The multiple reaction chamber system of claim 12, wherein the multiple reaction chamber system controller is one selected from a group consisting of a chemical vapor deposition (CVD) system controller, a sputter system controller, and a dry etch system controller.

14. In a multiple reaction chamber system having a load lock chamber, a plurality of reaction chambers and an alignment chamber comprising a wafer aligner, a wafer processing method comprising:
    forming a recognition code on a wafer;
    loading the wafer into the load lock chamber;
    transferring the wafer into the alignment chamber;
    aligning the wafer in the alignment chamber;
    recognizing the recognition code using a wafer recognition system by examining the wafer while the wafer is in a post-alignment path along which wafers are transferred inside the multiple reaction chamber system from the wafer aligner to any selected one of the reaction chambers;
    selecting a designated reaction chamber of the plurality of reaction chambers to process the wafer and, using the recognized recognition code of each wafer to produce data correlating each wafer with the reaction chamber designated for processing the wafer;
    processing the wafer in the designated reaction chamber; and
    inspecting the processed wafer.

15. The wafer processing method of claim 14, wherein the recognition code is formed in a flat zone of the wafer.

16. The wafer processing method of claim 14, wherein said recognizing is performed in the alignment chamber.

17. The wafer processing method of claim 14, wherein a code type of the recognition code is one selected from a group consisting of a numerical code type, an alphabetic code type, an alphanumerical code type, and a bar code type.

18. The wafer processing method of claim 17, said forming comprising embossing the recognition code.

19. The wafer processing method of claim 17, said forming comprising engraving the recognition code.

20. The wafer processing method of claim 17, said recognizing further comprising:

illuminating the recognition code with an illuminating unit of an optical code recognition (OCR) system;

receiving light reflected by the recognition code with a light receiving unit of the OCR system;

transmitting a first signal corresponding to the light received by the light receiving unit;

interpreting an identification code corresponding to the recognition code from the first signal using an OCR controller of the OCR system, the OCR controller having a first signal output port, a second signal output port and a remote controller port;

outputting a second signal corresponding to the identification code to a first interface board connected to the first signal output port;

outputting a third signal corresponding to the identification code to a second interface board connected to the first interface board; and displaying the identification code at a monitor connected to the second signal output port.

21. The wafer processing method of claim 17, said selecting further comprising:

transmitting a data signal, indicative of an identification code corresponding to the recognition code, from the wafer recognition system to a multiple reaction chamber system controller of a controlling system;

transmitting a control signal, indicative of the designated chamber, from the controlling system to a transfer chamber of the multiple reaction chamber system.

22. The wafer processing method of claim 21, said selecting further comprising determining whether the designated chamber is a malfunctioning chamber on the basis of said data correlating a wafer with the processing chamber designated to process the wafer and said inspecting of the processed wafer, and if so, selecting another one of the plurality of reaction chambers to process the wafer.

* * * * *